Oct. 17, 1967 W. E. ARNOLD 3,348,070

TIME DELAY COMPUTER ELEMENT FOR INDICATING INPUT CONDITIONS

Filed May 20, 1965

WITNESSES:

Bernard R. Gieguay

James F. Young

INVENTOR

Wayne E. Arnold

BY

ATTORNEY

United States Patent Office 3,348,070

Patented Oct. 17, 1967

3,348,070

TIME DELAY COMPUTER ELEMENT FOR INDICATING INPUT CONDITIONS

Wayne E. Arnold, Murrysville, Pa., assignor to Westinghouse Electric Corporation, Pittsburgh, Pa., a corporation of Pennsylvania Filed May 20, 1965, Ser. No. 457,412

6 Claims. (Cl. 307—88.5)

ABSTRACT OF THE DISCLOSURE

The present disclosure relates to a time delay circuit utilizing a plurality of semiconductor switching devices, such as silicon controlled rectifiers. A first input condition causes a first of the devices to be turned-on, while a second input condition causes a second of the devices to be turned-on. The first device is turned off in response to turning on of the second device. After a predetermined time delay commencing with the turning on of the second device a third device is turned-on indicating the original input condition.

The present invention relates to time delay circuits, and more particularly to time delay circuits for use in computer control systems.

A time delay circuit is often needed in many computer applications, especially in computer control systems. In such an environment, the time delay circuit or element should have the capability of operation with mechanical or static switching devices and be capable of operation at various logic voltage levels. Prior art time delay circuits have fallen short in certain respects to meet these capabilities. A common time delay circuit of the prior art utilizes a capacitive time delay input circuit in conjunction with transistor switching circuitry. A major disadvantage of the capacitive time delay input circuit is that of erratic charging of the capacitive elements causing inconsistent delay operation in the circuit. Erratic discharging may be due to contact bounce at the input or due to other spurious signals being introduced at the input to the delay circuit. Moreover, the use of transistors may necessitate the use of various transistor amplifying stages to provide a properly amplified output signal from the time delay circuit. Also, the use of a capacitive time delay input limits the adaptability of the circuit when the use of various logic voltage levels are desired.

It is, therefore, an object of the present invention to provide a new and improved time delay computer circuit.

It is a further object of the present invention to provide a new and improved time delay computer element which has a high power capability.

It is a still further object of the present invention to provide a new and improved time delay computer element which provides a time delay substantially independent of variations in the input switching to the element.

It is a still further object of the present invention to provide a new and improved time delay computer element which is readily adaptable to be used with various input voltage or logic levels.

Broadly, the above-cited objects are provided in a time delay circuit utilizing a plurality of controlled switching devices. Input signals to the circuit are supplied through a transformer means which control the turning on of selected ones of the devices. A controllable time delay circuit is operative with one of the controlled devices so that after a predetermined time delay another of the controlled devices is turned on to provide an output signal from the circuit.

Figure 1:
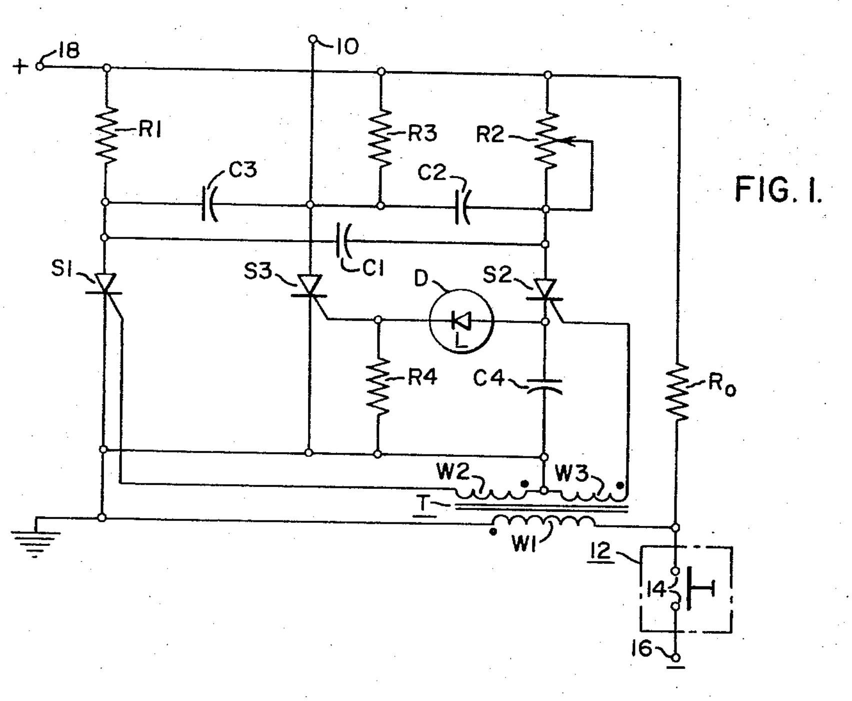
Figure 2:
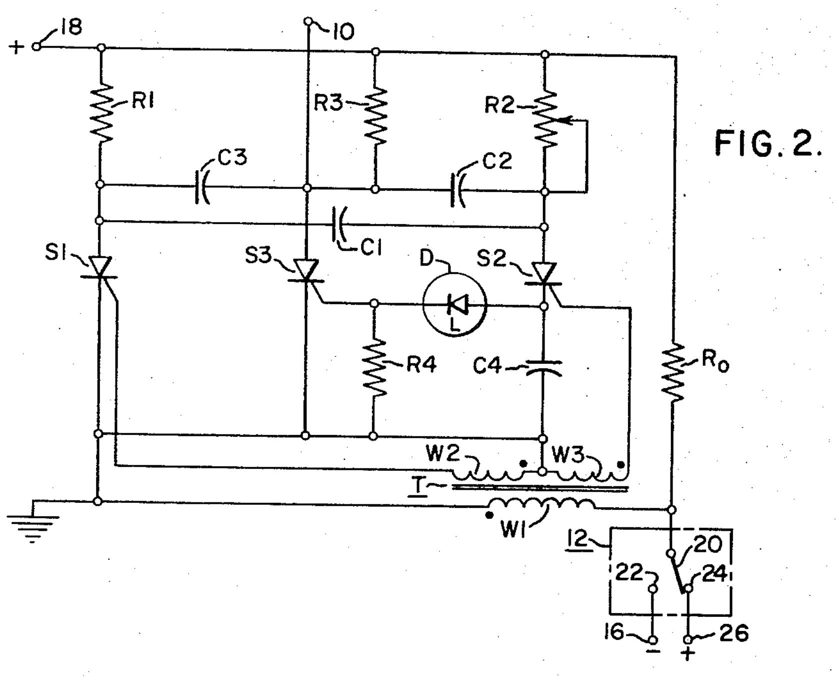

These and other objects and advantages of the present invention will become more apparent when considered in view of the following specification and drawings, in which:

FIGURE 1 is a schematic diagram of the time delay computer element of the present invention; and FIG. 2 is a schematic diagram of the time delay computer element of the present invention showing the use of a modified input switching device.

Referring to FIG. 1, the time delay element of the present invention is shown which is capable of supplying an output signal at a terminal 10 in response to an input switching device, shown by the dotted box 12, changing switching states. In FIG. 1, the input switching device 12 is shown as a pair of normally open contacts 14 with the changing of states to provide an output signal at the terminal 10 being made in response to the contacts 14 changing from an open to a closed state. One end of the pair of contacts 14 is connected to a terminal 16 to which a source of negative potential, not shown, is to be applied. The other end of the pair of contacts 14 is connected at a junction between a resistor R*o* and a primary winding W1 of a pulse transformer T. The pulse transformer T has a pair of secondary winding W2 and W3 with a junction therebetween. A dot convention is established as shown for the winding W1, W2 and W3 of the pulse transformer T. Thus, if a positive polarity signal appears at the dotted end of the primary winding W1, a positive polarity signal also appears at the dotted ends of the secondary windings W2 and W3. The primary and secondary winding are so poled to control the conductive states of the devices S1, S2 and S3 in response to input information being supplied to the circuit as will be explained below.

The dotted end of the primary winding W1 is connected to the cathode electrode of a controlled switching device S1 which is grounded. The controlled switching device S1 may comprise a well known semiconductor device commonly called a silicon controlled rectifier (SCR), which has the capability of being rendered conductive by the application of a positive polarity signal to the gate electrode thereof. The device may be rendered nonconductive by reducing the anode-cathode current therethrough or by reverse or back biasing the device to make the cathode electrode positive with respect to the anode electrode. Two other similar controlled rectifying devices S2 and S3 are utilized also herein in the circuit of FIG. 1.

Assume initially that the input switching device 12 in its open condition as shown and that the controlled rectifier devices S1, S2 and S3 are in their nonconductive, turned-off state. When a positive polarity voltage is applied to a terminal 18, for example by connecting a source of direct voltage thereto, not shown, current will pass from the terminal 18 through the resistor R*o* into the undotted end of the primary winding W1 to ground. Due to the dot convention on the secondary winding W2, a positive polarity signal will be induced at the undotted end of the winding W2, which is connected to the gate electrode of the device S1, to turn on the controlled rectifier device S1. A current path will thus be provided from the terminal 18 through a resistor R1 connected between the terminal 18 and the anode of the device S1 through the device S1 to the cathode electrode thereof which is grounded. The controlled rectifier device S1 will remain in the on state while the input switching device 12 remains in its open condition. It should be noted that the devices S2 and S3 will remain in their nonconductive state since no turn-on signals of a positive polarity are applied to the gate electrodes thereof as will be explained below. Three capacitors C1, C2 and C3 are connected, respectively, between the anode electrodes of the devices S1 and S2, S2 and S3 and S1 and S3. With the controlled rectifier S1 in its conductive state, the capacitor C1 will charge to a positive polarity at the side adjacent the device S2, a charging path being provided from the positive source terminal 18 through a variable resistor R2. The resistor R2 is also connected to the anode electrode of the controlled rectifier device S2.

With the device S1 turned on and the input switching device 12 in its open condition, the output terminal 10, which is connected at the anode of the controlled rectifier device S3, will be at substantially the voltage level of the positive source since the controlled rectifier S3 is in its nonconductive state under these conditions. When the device S3 is turned on, the voltage at the output terminal 10 will go substantially to ground and an output signal will be provided at the terminal 10, after a predetermined time delay, when the input switching device 12 is switched to its closed state as may be seen from the following discussion.

The closing of the contacts 14 will provide a conductive path between ground and the negative terminal 16. With current flow in such a direction, a positive polarity signal will appear at the dotted ends of the various windings W1, W2 and W3. A positive polarity signal will be applied to the gate electrode of the controlled rectifier device S2 from the dotted end of the winding W3. This signal will render the device S2 conductive. The controlled rectifier device S2 being conductive current will flow from the positive terminal 18 through the variable resistor R2, and the device S2 to a capacitor C4, which has one end connected to the cathode electrode of the controlled rectifier device S2 and the other end connected to ground and to the tap between secondary windings W2 and W3.

At the time the controlled rectifier device S2 is made conductive, the controlled rectifier device S1 will be rendered nonoconductive in that it will be back biased from the previously charged capacitor C1 connected between the anode electrodes of the devices S1 and S2. The back biasing will render the cathode of the device S1 positive with respect to its anode and thereby render it nonconductive. The controlled rectifier device S3 will, however, remain in its nonconductive state since no turn-on signal is applied to the gate electrode thereof.

At the time the controlled rectifier S2 is rendered conductive, the time delay of the present circuit begins with the capacitor C4 being charged through the variable resistor R2 and the anode-cathode circuit of the device S2. The capacitor C4 will charge to a positive polarity at the cathode electrode of the device S3 with the time rate of charging being adjustable through the tap on the resistor R2.

Between the gate electrode of the controlled rectifier device S3 and the anode electrode of the device S2 is connected a breakdown diode D. The breakdown diode D may comprise any one of a number of well known semiconductor devices which provide a high impedance in its forward direction until a voltage exceeding its breakover value is applied thereacross. With the application of such a breakover voltage, the device assumes a low impedance in its forward direction. A resistor R4 is connected between the cathode of the breakover diode D and ground to complete the circuit across the capacitor C4. When the capacitor C4 has charged to a voltage which exceeds the breakover voltage of the diode D, the diode D will break over and provide a low impedance conductive path therethrough to apply a positive polarity signal to the gate electrode of the controlled rectifier S3. This signal will render the device S3 conductive, a current path being provided from the positive terminal 18 through the resistor R3 and the device S3 to ground. The capacitor C4 will discharge through the resistor R4 to ground to be in a discharged state for the next time delay.

When the controlled rectifier device S2 in conductive and the devices S1 and S3 were in their nonconductive state, the capacitor C2 connected between the anodes of the devices S2 and S3 would be charged to a positive polarity on the side adjacent the anode of the controlled rectifier device S3. Thus, when the device S3 is turned on, with the breakover device D breaking over to provide a turn-on signal to the gate electrode thereof, a back biasing potential is applied across the cathode to anode electrodes of the device S2 from the capacitor C2 through the conductive device S3. The back biasing of the controlled rectifier S2 will thereby turn off the device S2. With the device S3 conductive and the devices S1 and S2 nonconductive, an essentially ground potential output signal will be provided at the output terminal 10, which is connected at the anode electrode of the controlled rectifier S3. It should be noted since controlled rectifier devices have relatively high current carrying capacities, a load connected to the output terminal 10 may be supplied with a relatively large amount of current without damaging the device S3 and also without the necessity of providing additional amplifying stages.

With the input switching device 12 in its closed state, the controlled rectifier S3 will remain in its turned on state providing a ground level output pulse at the terminal 10 and the controlled rectifier devices S1 and S2 will remain in their nonconductive states. The capacitor C3 will charge to a positive polarity on its side adjacent the anode electrode of the controlled rectifier S1 through the resistor R1. When the contacts 14 are opened, the ground output signal from terminal 10 will be removed and the ouput will go positive to indicate that the input information to the input switching device has been removed. This may be seen by the following.

By opening the contacts 14, current will pass from the positive terminal 18 through the resistor $R_o$ into the undotted end of the primary winding W1 to ground. Because of the winding W2 being so poled, a positive polarity signal will be applied to the gate electrode of the controlled rectifier device S1 which will be thus turned on. The controlled rectifier device S1 being conductive, the controlled device S3 will be back biased from its cathode to anode electrode by the previously charged capacitor C3 which will apply a positive polarity voltage through the controlled rectifier device S1 to the cathode electrode of the device S3. The controlled rectifier device S3 will thus be rendered nonconductive causing its anode electrode to go positive which will be seen at the terminal 10 as a positive signal indicating that the input condition has been removed.

In the time delay circuit of FIG. 1, if the contacts 14 should bounce, i.e., suddenly open and reclose, this would present no problem if the time constant of the circuit including the resistor R2 in the capacitor C1 is designed to be longer than the time of the contact bounce. The capacitor C1 provides the back biasing potential through the controlled rectifier device S2 to turn off the device S1 when the contacts 14 close. If, however, the contacts 14 should bounce open again, current would be provided through the primary winding W1, in such a direction to apply a positive signal to the gate electrode of the controlled rectifier device S1 tending to turn it on again. However, by making the time constant of the charging current including the resistor R2 and the capacitor C1 longer than the bounce time, once the contacts close again, sufficient charge would remain on the capacitor C1 to back bias the controlled rectifier S1 to maintain it in a turned-off state.

In FIG. 2 is shown another embodiment of the time delay circuit of the present invention which provides complete independence from contact bounce. The circuit of FIG. 2 is identical to that of FIG. 1 and similar reference characters are so designated in FIG. 2. In FIG. 2, however, the input switching device 12 comprises a throw type of switch which includes a throw arm 20 which is movable to make contacts between a pair of contacts 22 and 24 respectively. The contact 22 is connected to the negative voltage terminal 16 and the contact 24 is connected to a positive terminal 26 which may be supplied from a positive source of potential similar to that applied to the terminal 18. In FIG. 2, the resistor R*o* of FIG. 1 has been eliminated so that the primary winding W1 is connected to the positive source through the throw arm 20 of the input switching device 12 rather than being permanently connected through the resistor R*o*. The operation of the time delay circuit of FIG. 2 is identical to that of FIG. 1.

With the throw arm 20 engaging the contact 24, the controlled rectifier device S1 will be placed in a conductive state. When an input signal is received by the input switching device, the throw arm 20 will be moved to engage the contact 22 which will cause the controlled rectifier S2 to be turned on and begin the time delay of the circuit which is determined by the variable resistor R2 and the capacitor C4. After a predetermined length of time for the capacitor C4 to charge to a predetermined voltage, the breakover diode D will break over applying a positive signal to the controlled rectifier S3 turning it on to provide an output signal at the terminal 10. To return the circuit of FIG. 2 to its original state, the throw arm 20 is returned to the contact 24 which will apply a turn-on signal to the gate electrode of the device S1 rendering the device S3 nonconductive as explained above. The bounce problem is eliminated in the circuit of FIG. 2 by the use of normally open contact connected to the negative voltage source, while the normally closed position of the switch is connected to the positive voltage source.

Although the present invention has been described with a certain degree of particularity, it should be understood that the present disclosure has been made only by way of example and that the numerous changes in the details of fabrication and circuitry and the combination and arrangement of elements and components may be resorted to without departing from the scope and the spirit of the present invention.

I claim as my invention:

1. A time delay circuit comprising, a plurality of controlled rectifier devices, input means for turning on a first of said devices when a first input condition exists and turning on a second of said devices when a second input condition exists, means to turn off said first device when said second device is turned on, means having a time delay instigated by the turning on of a second device to turn on a third of said devices after a predetermined time delay, means to turn off said second device when said third device is turned on, and output means operatively connected to said third device to provide an output signal indicative of the input condition existing at said input means.

2. A time delay circuit comprising, a plurality of controlled rectifier devices, input means for turning on a first of said devices when a first input condition exists and turning on a second of said devices when a second input condition exists, first biasing means operatively connected between said first and second devices to turn off said first device when said second device is turned on, time delay means having a time delay instigated by the turning on of said second device to turn on a third of said devices after a predetermined time delay, second biasing means operatively connected between said second and third devices to turn off said second device when said third device is turned on, and output means operatively connected to one of said devices to provide an output signal indicative of the input condition existing at said input means.

3. A time delay computer element comprising: input switching means operative in a first or second state; first, second and third controlled rectifier devices, each of said devices including anode, cathode, and gate electrodes, the cathode electrodes of said first and second devices being operatively connected; transforming means including primary and secondary windings, said primary winding operatively connected to said input switching means, said secondary winding operatively connected between said input switching means to the gate electrodes of said first and second devices, and being operative so that said first device is turned on when said input switching means is placed in a first state and said second device is turned on when said input switching means is placed in a second state; means operatively connected between the anode electrodes, respectively, of said first, second, and third devices to turn off, respectively, said first device when said second device is turned on, said second device when said third device is turned on, and said third device when said first device is turned on; time delay means operatively connected between the cathode electrode of said second device and the gate electrode of said third device and having a time delay instigated by the turning on of said second device to turn on said third device after a predetermined time delay; and output means to provide an output signal in response to said third device being turned on.

4. A time delay computer element comprising: input switching means operative in a first or second state; first, second and third controlled rectifier devices, each of said devices including anode, cathode and gate electrodes, the cathode electrodes of said first and second devices being operatively connected; transforming means operatively connected between said input switching means and the gate electrodes of said first and said second devices, and being operative so that said first device is turned on when said input switching means is placed in a first state and said second device is turned on when said input switching means is placed in a second state; energy storage means operatively connected respectively between the anode electrodes of said first and second, said second and third, and said first and third devices to turn off respectively, said first device when said second device is turned on, said second device when said third device is turned on, and said third device when said first device is turned on; time delay means having a predetermined time constant operatively connected in the anode-cathode circuit of said second device; threshold means operatively connected between said time delay means and the gate electrode of said third device to apply a turn on signal thereto after a predetermined time has expired; and output means operatively connected to the anode electrode of said third device to provide an output signal after a predetermined time from the time said input switching means is switched to a second state.

5. A time delay computer element operative with a source of direct potential comprising: input switching means operatively connected to said source and being operative in a first or second state; first, second and third controlled rectifier devices, each of said devices including anode, cathode and gate electrodes, the cathode electrodes of said first and second devices being operatively connected; a pulse transformer including primary and secondary windings, said primary winding operatively connected to said input switching means, said secondary winding operatively connected to the gate electrodes of said first and second devices, said primary and secondary windings being so poled that said first device is turned on when said input switching means is placed in a first state and said second device is turned on when said input switching means is placed in a second state; biasing means operatively connected between the anode electrodes of said first and second, said second and third, and said first and third devices to turn off, respectively, said first device when said second device is turned on, said second device when said third device is turned on, and said third device when said first device is turned on; a time delay circuit having a predetermined time constant operatively connected in the anode-cathode circuit of said second device; means operatively connected between said time delay circuit and the gate electrode of said third device to apply a turn-on signal thereto after a predetermined time; and output means operatively connected to the anode electrode of said third device to provide an output signal when said third device is turned on.

6. A time delay computer element operative with a source of direct potential comprising: input switching means operatively connected to said source and being operative in a first or second state; first, second and third controlled rectifier devices, each of said devices including anode, cathode and gate electrodes the cathode electrodes of said first and second devices being operatively connected; a pulse transformer including primary and secondary windings, said primary winding operatively connected to said input switching means, said secondary winding operatively connected to the gate electrodes of said first and second devices, said primary and secondary windings being so poled that said first device is turned on when said input switching means is placed in a first state and said second device is turned on when said input switching means is placed on a second state; first, second and third capacitors operatively connected respectively between the anode electrodes of said first and second, said second and third and said first and third controlled rectifier devices to turn off, respectively, said first device when said second device is turned on, said second device when said third device is turned on, and said third device when said first device is turned on; a time delay circuit including a variable resistor and a time delay capacitor operatively connected in the anode-cathode circuit of said second device; a breakover diode operatively connected between said time delay capacitor of said time delay circuit and the gate electrode of said third device to apply a turn-on signal thereto after a predetermined time; and output means operatively connected to the anode electrode of said third device to provide an output signal after a predetermined time from the time said input switching means is switched to a second state.

References Cited

UNITED STATES PATENTS

| | | | |
|---|---|---|---|
| 2,892,101 | 6/1959 | Bright | 307—88.5 |
| 2,924,724 | 2/1960 | Booker | 307—88.5 |
| 3,143,665 | 8/1964 | Smith | 307—88.5 |
| 3,167,664 | 1/1965 | Stascavage | 307—88.5 |
| 3,230,394 | 1/1966 | Kintner | 307—88.5 |

ARTHUR GAUSS, *Primary Examiner.*

S. D. MILLER, *Assistant Examiner.*